(12) United States Patent
Li et al.

(10) Patent No.: US 11,553,616 B2
(45) Date of Patent: Jan. 10, 2023

(54) MODULE WITH POWER DEVICE

(71) Applicant: Delta Electronics, Inc., Taoyuan (TW)

(72) Inventors: Wenhua Li, Shanghai (CN); Xueliang Chang, Shanghai (CN); Yahong Xiong, Shanghai (CN); Qinghua Su, Shanghai (CN)

(73) Assignee: DELTA ELECTRONICS, INC., Taoyuan (TW)

( * ) Notice: Subject to any disclaimer, the term of this patent is extended or adjusted under 35 U.S.C. 154(b) by 52 days.

(21) Appl. No.: 17/195,320

(22) Filed: Mar. 8, 2021

(65) Prior Publication Data

US 2021/0195779 A1 Jun. 24, 2021

Related U.S. Application Data

(63) Continuation-in-part of application No. 16/690,444, filed on Nov. 21, 2019, now Pat. No. 10,973,153.

(30) Foreign Application Priority Data

Dec. 7, 2018 (CN) .......................... 201811494055.7

(51) Int. Cl.
*H05K 7/20* (2006.01)
*H05K 7/02* (2006.01)
(Continued)

(52) U.S. Cl.
CPC .............. *H05K 7/02* (2013.01); *H01L 23/31* (2013.01); *H01L 23/3677* (2013.01);
(Continued)

(58) Field of Classification Search
None
See application file for complete search history.

(56) References Cited

U.S. PATENT DOCUMENTS 7,310,233 B2 * 12/2007 Bell ................... H05K 7/20509
165/185
8,188,594 B2 * 5/2012 Ganesan ........... H01L 23/49827
257/E23.101
(Continued)

FOREIGN PATENT DOCUMENTS

CN 1442902 A 9/2003
CN 102610577 A 7/2012
(Continued)

*Primary Examiner* — Courtney L Smith
(74) *Attorney, Agent, or Firm* — Kirton McConkie; Evan R. Witt

(57) ABSTRACT

The present disclosure provides a module including a circuit board, a first component and a second component. The circuit board includes a first side and a second side opposite to each other and includes a first plane and second plane disposed on the first side. A first height difference is formed between the first plane and the second plane. The first component and the second component are disposed on the first plane and the second plane, respectively. The first component and the second component include a first contact surface and a second contact surface, respectively. The first contact surface and the second contact surface are coplanar with a first surface of the module. It benefits to reduce the design complexity of a heat-transfer component, and enhance the heat dissipation capability and the overall power density of the module simultaneously.

21 Claims, 17 Drawing Sheets

(51) Int. Cl.
  *H01L 23/532* (2006.01)
  *H02M 3/155* (2006.01)
  *H01L 23/31* (2006.01)
  *H01L 23/367* (2006.01)

(52) U.S. Cl.
  CPC ...... *H01L 23/53228* (2013.01); *H02M 3/155* (2013.01); *H05K 7/20* (2013.01)

(56) References Cited

U.S. PATENT DOCUMENTS

| | | | |
|---|---|---|---|
| 8,553,417 B2 * | 10/2013 | Park | H05K 1/053 361/720 |
| 9,468,104 B2 * | 10/2016 | Kakehashi | H05K 1/141 |
| 2007/0194336 A1 * | 8/2007 | Shin | H01L 33/483 438/27 |
| 2011/0013365 A1 * | 1/2011 | Oota | H02K 11/33 361/707 |
| 2012/0075807 A1 * | 3/2012 | Refai-Ahmed | H01L 23/49827 257/E23.101 |
| 2013/0075776 A1 * | 3/2013 | Murai | G02B 19/0071 438/26 |
| 2014/0002989 A1 | 1/2014 | Ahuja et al. | |
| 2016/0155682 A1 * | 6/2016 | Ahuja | H01L 25/50 438/122 |
| 2019/0109267 A1 * | 4/2019 | Lee | H01L 33/20 |

FOREIGN PATENT DOCUMENTS

| | | |
|---|---|---|
| CN | 102856316 A | 1/2013 |
| CN | 203457035 U | 2/2014 |

* cited by examiner

MODULE WITH POWER DEVICE

CROSS-REFERENCE TO RELATED APPLICATION

This application is a continuation-in-part application of U.S. application Ser. No. 16/690,444 filed on Nov. 21, 2019, and entitled "POWER MODULE", which claims priority to China Patent Application No. 201811494055.7, filed on Dec. 7, 2018. The entire contents of the above-mentioned patent applications are incorporated herein by reference for all purposes.

FIELD OF THE INVENTION

The present disclosure relates to a module with power devices, and more particularly to a module having an optimized circuit board.

BACKGROUND OF THE INVENTION

On-board high-power DC/DC power modules are widely used in telephony, data centers, and supercomputers. However, with the rapid development of landline and mobile communication, the requirements for output power and efficiency of on-board high-power DC/DC power modules are also increasing. On the other hand, with the trend of increasingly miniaturized communication products, it is inevitable that the power module used can increase the efficiency while reducing the volume to increase the power density. Therefore, the heat dissipation problem of the on-board high-power DC/DC power module at high power density is also becoming more and more serious, and its design for heat dissipation is becoming more and more complicated.

A conventional on-board high-power DC/DC power module is soldered to a system board through pins, and at least one component of the module is disposed on a circuit board of the module. Heat of the component can be dissipated through a heat dissipation device, for example, a heat sink or a baseplate. However, when two components of different heights are disposed on the circuit board, the bottom surface of the heat dissipation device has to form a stepped structure according to the two different heights of components, so as to dissipate the heat generated from the components. It results in a longer design cycles for the heat dissipation device and the complexity in the production process is increased.

Therefore, there is a need of providing a module to overcome the above drawbacks.

SUMMARY OF THE INVENTION

An object of the present disclosure is to provide a module. By optimizing the circuit board to carry components with different heights, a surface is formed to facilitate the assembly of heat dissipation device disposed thereon. It benefits to reduce the design complexity of the heat dissipation device, wherein the heat dissipation device can be a heat sink or a baseplate and so on. Here, a heat sink is used as an example. The problem of the heat dissipation assembly structure of, for example, the DC/DC power modules is solved. Thus, the heat dissipation capability and the overall power density of the module are enhanced simultaneously.

Another object of the present disclosure is to provide a module. By flattening a plurality of contact surfaces of the module into a surface, the process of assembling and fixing the module to the heat sink and the system board is simplified. Consequently, the labor-saving is achieved, the production cost is reduced, and the reliability of the assembled structure is improved.

Other object of the present disclosure is to provide a module. By flattening a plurality of contact surfaces of the module and the metal contact surface of the metal device into a surface, the process of assembling and fixing the module to the heat dissipation device and the system board is simplified. Moreover, it is more helpful to increase the pressure resistance and the supporting ability of the power module. Consequently, the size of the heat dissipation device in the entire assembling structure is reduced, the heat dissipation capability is enhanced and the purpose of improving the overall power density is achieved. In addition, the packaging of the plastic sealing layer can further effectively eliminate the tolerance of the total height of the power module in mass production, and enhance the convenience of assembly of the power module.

In accordance with an aspect of the present disclosure, a module is provided. The module includes a circuit board, at least one first component and at least one second component. The circuit board includes a first side and a second side opposite to each other and includes at least one first plane and at least one second plane disposed on a surface of the first side. A first height difference is formed between the at least one first plane and the at least one second plan. The at least one first component and the at least one second component are disposed on the at least one first plane and the at least one second plane, respectively. The at least one first component includes at least one first contact, and the at least one second component includes at least one second contact surface. The at least one first contact surface and the at least one second contact surface are parts of a first surface of the module.

In accordance with another aspect of the present disclosure, another module is provided. The module includes a circuit board, at least one first component, at least one second component, at least one third component and at least one fourth component. The circuit board includes a first side and a second side opposite to each other. The circuit board includes at least one first plane, at least one second plane, at least one third plane and at least one fourth plane. The at least one first plane and the at least one second plane are disposed on a surface of the first side and a first height difference is formed between the at least one first plane and the at least one second plane. The at least one third plane and the at least one fourth plane are disposed on a surface of the second side and a second height difference is formed between the at least one third plane and the at least one fourth plane. The at least one first component is disposed on the at least one first plane and the at least one second component is disposed on the at least one second plane. The at least one first component includes at least one first contact surface, the at least one second component includes at least one second contact surface, and the at least one first contact surface and the at least one second contact surface are parts of a first surface of the module. The at least one third component is disposed on the at least one third plane, and the at least one fourth component is disposed on the at least one fourth plane. The at least one third component includes at least one third contact surface, the at least one fourth component includes at least one fourth contact surface, and the at least one third contact surface and the at least one fourth contact surface are parts of a second surface of the module.

The above contents of the present disclosure will become more readily apparent to those ordinarily skilled in the art after reviewing the following detailed description and accompanying drawings, in which:

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
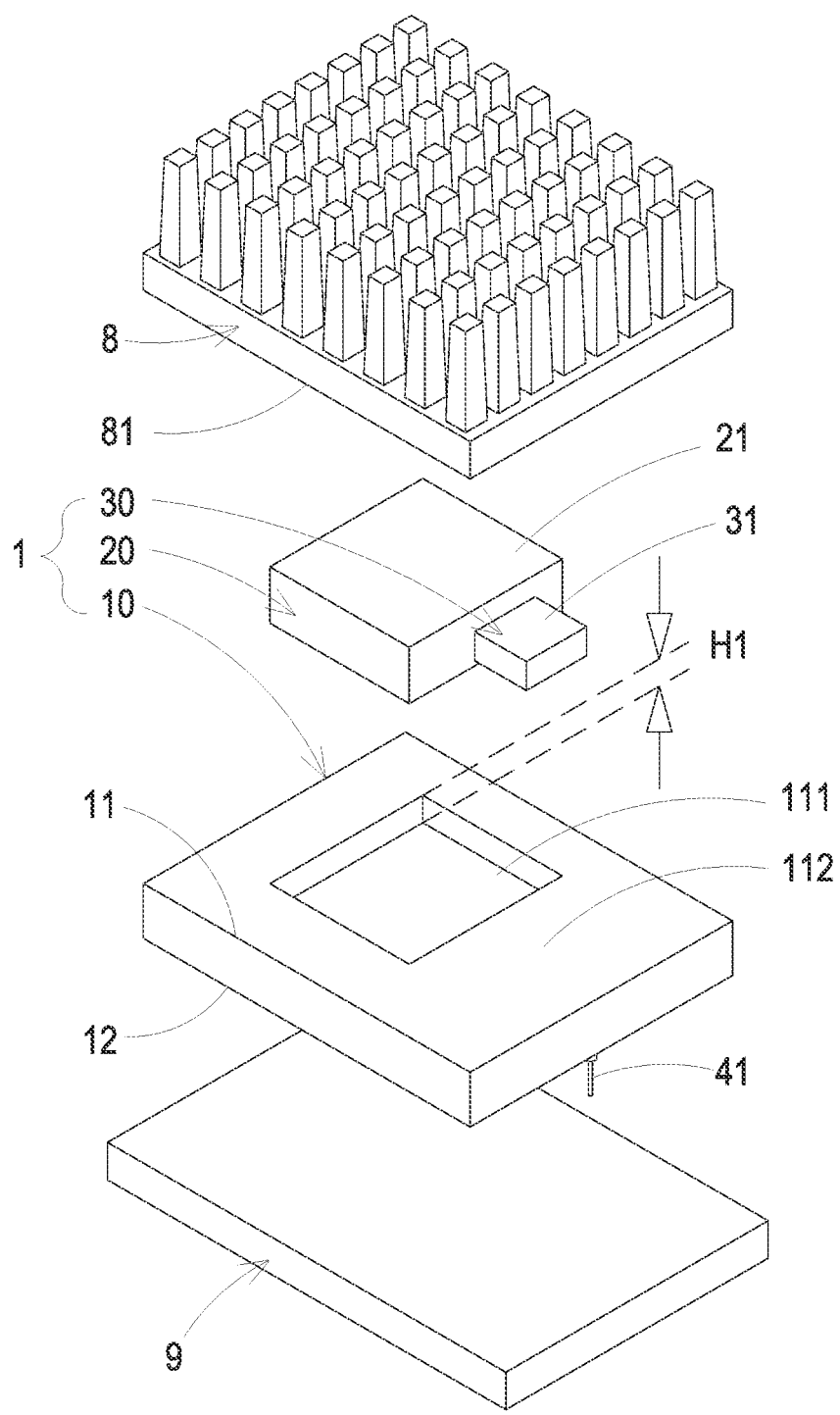
FIG. 1 is an exploded view illustrating a power module with a heat sink and a system board thereof according to a first embodiment of the present disclosure.
Figure 2:
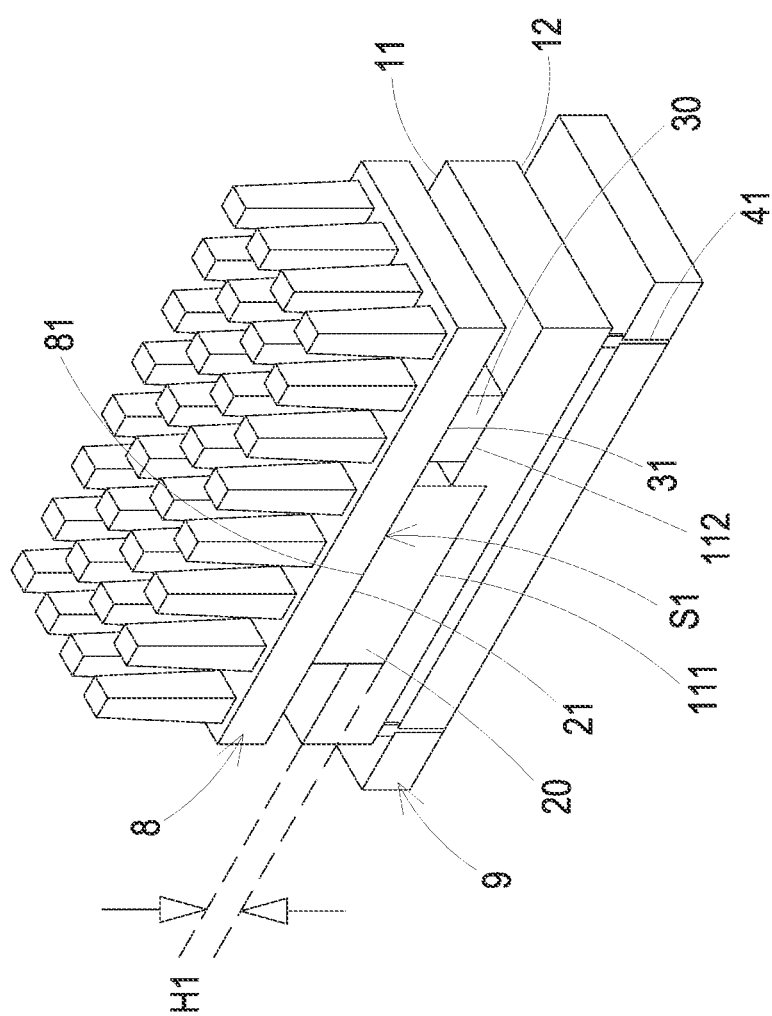
FIG. 2 is a cross-sectional structure illustrating the power module with the heat sink and the system board thereof according to the first embodiment of the present disclosure.
Figure 3:
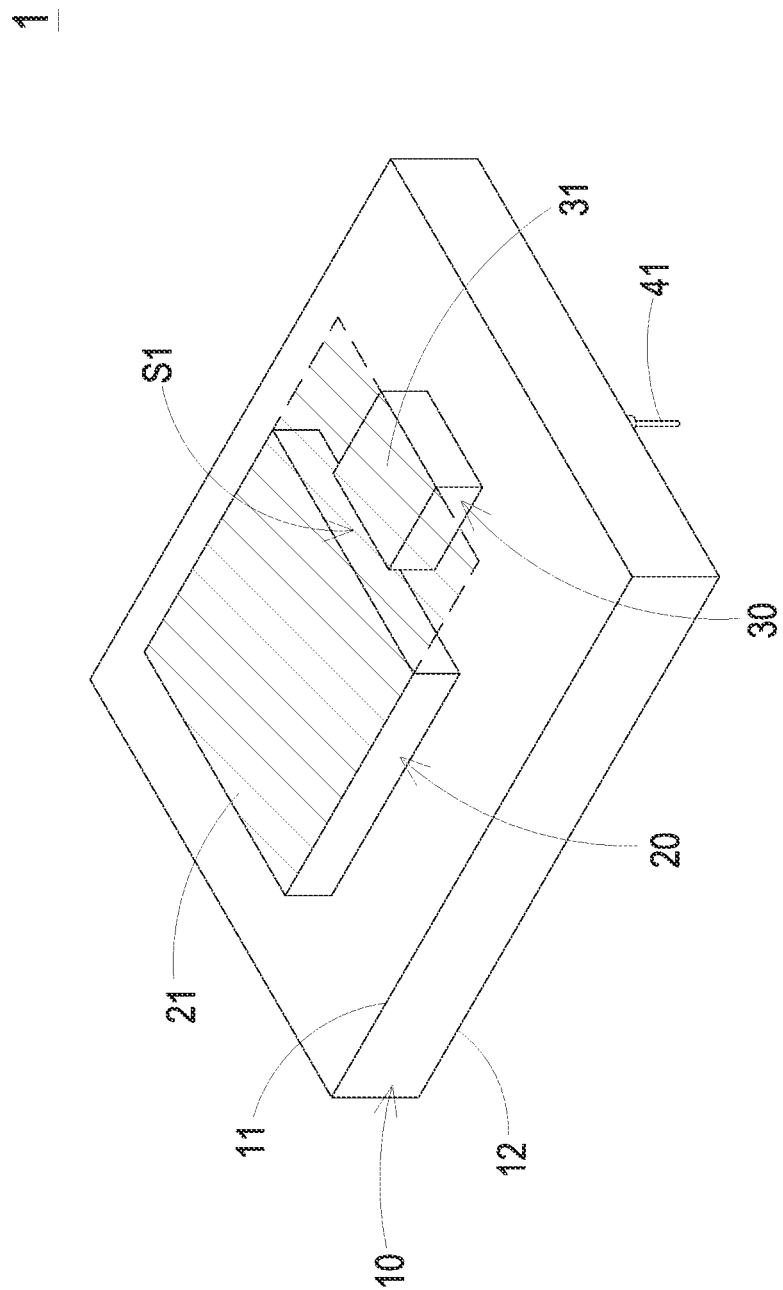
FIG. 3 is a perspective structural view illustrating the power module according to the first embodiment of the present disclosure.

FIG. 1 is an exploded view illustrating a power module with a heat sink and a system board thereof according to a first embodiment of the present disclosure. FIG. 2 is a cross-sectional structure illustrating the power module with the heat sink and the system board thereof according to the first embodiment of the present disclosure. FIG. 3 is a perspective structural view illustrating the power module according to the first embodiment of the present disclosure. Firstly, as shown in FIGS. 1, 2 and 3, the power module 1 can be for example but not limited to a DC/DC power module. The power module 1 includes a circuit board 10, at least one first component 20 and at least one second component 30. The circuit board 10 includes a first side 11 and a second side 12. The first side 11 and the second side 12 are opposite to each other. In the embodiment, the circuit board 10 further includes at least one first plane 111 and at least one second plane 112 disposed on the surface of the first side 11. A first height difference H1 is formed between the at least one first plane 111 and the at least one second plane 112. Preferably but not exclusively, the at least one first component 20 and the at least one second component 30 are a magnetic component and a switch component, respectively. The at least one first component 20 is a thicker magnetic component and disposed on the first plane 111. The at least one second component 30 is a thinner switch component and disposed on the at least one second plane 112. Namely, the thickness of the first component 20 is greater than the thickness of the second component 30. Certainly, the present disclosure is not limited thereto. In the embodiment, the at least one first component 20 includes a first contact surface 21. The at least one second component 30 includes a second contact surface 31. While the first component 20 is attached to the first plane 111 and the second component 30 is attached to the second plane 112, the at least one first contact surface 21 and the at least one second contact surface 31 are parts of a first surface S1 of the power module 1. In the embodiment, the first surface S1 is the slash area shown in FIG. 3. Thus, the first surface S1 of the power module 1 is advantageously assembled and fixed to a heat sink 8, so that the first contact surface 21 of the first component 20 and the second contact surface 31 of the second component 30 are sufficiently adhered to the heat dissipation surface 81 of the heat sink 8 and an optimal heat dissipation effect is achieved. On the other hand, the first surface S1 is one plane, which is suitable for the heat dissipation surface 81 designed as a planar surface. It benefits to effectively reduce the design complexity of the heat sink 8 required for the power module 1. Moreover, it is helpful to configure the heat dissipation of, for example, a DC/DC power module and enhance the heat dissipation capability and the overall power density of the power module 1 simultaneously. Certainly, the manner of attaching the heat sink 8 to the first surface S1 of the power module 1 is not limited thereto. Preferably but not exclusively, the heat sink 8 is attached to the first surface S1 through the thermal interface materials, such as a thermal conductive sheet, a thermal conductive adhesive or a thermal conductive paste. The present disclosure is not limited thereto, and not redundantly described herein.

In the mass production, there is a distribution of the height between the first plane and the second plane and there is a distribution of the thickness of the first component or the second component. The distribution of the height or thickness is less than 50% of the thick of the thinner one between the first and two components.

In the embodiment, the power module 1 further includes at least one conductive component 41. Preferably but not exclusively, the at least one conductive component 41 includes a pair of pins disposed on the second side 12 of the power module 1. In the embodiment, the power module 1 is connected to a system board 9 through the conductive component 41, which can be for example, the pair of pins soldered therebetween. In other embodiment, the power module 1 is connected to the system board 9 through a copper block pin or a copper block. The present disclosure is not limited thereto.

Figure 4:
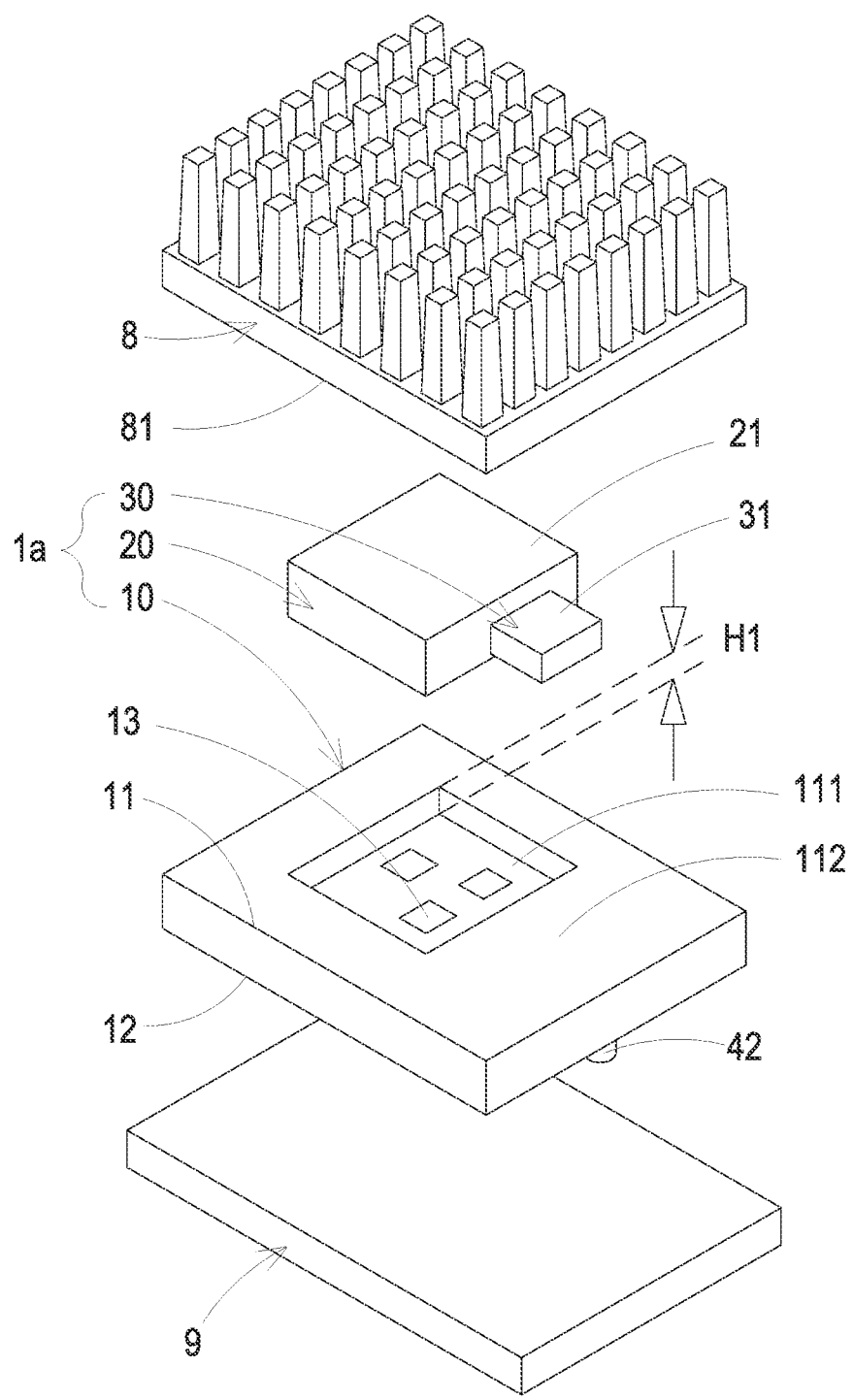
FIG. 4 is an exploded view illustrating a power module with a heat sink and a system board thereof according to a second embodiment of the present disclosure.
Figure 5:
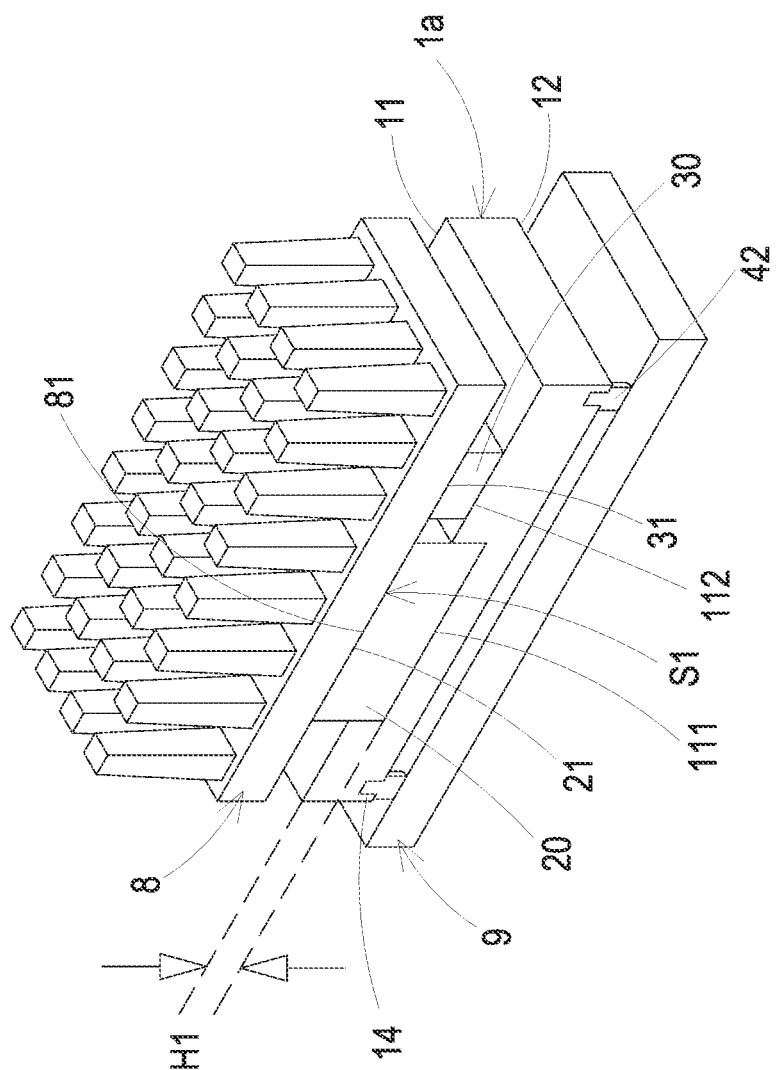
FIG. 5 is a cross-sectional structure illustrating the power module with the heat sink and the system board thereof according to the second embodiment of the present disclosure.

FIG. 4 is an exploded view illustrating a power module with a heat sink and a system board thereof according to a second embodiment of the present disclosure. FIG. 5 is a cross-sectional structure illustrating the power module with the heat sink and the system board thereof according to the second embodiment of the present disclosure. In the embodiment, the structures, elements and functions of the power module 1a are similar to those of the power module 1 in FIGS. 1 to 3, and are not redundantly described herein. Different from the power module 1 of FIGS. 1 to 3, in the embodiment, the circuit board 10 of the power module 1a further includes at least one conductive portion 13 disposed between the at least one first plane 111 and the first component 20. The conductive portion 13 can be, for example but not limited to, a conductive adhesive or a solder. Preferably but not exclusively, the first component 20 disposed on the first plane 111 can be a switch component, a magnetic component or a passive component, which is electrically connected to the circuit board 10. Certainly, the number, arrangement, type and shape of the conductive portion 13 are adjustable according to the practical requirements, so that the first component 20 disposed on the first plane 111 can be electrically connected with the circuit board 10 through the soldering pins with the shortest distance. The present disclosure is not limited thereto. In the embodiment, the circuit board 10 is a multilayer circuit board including, for example, N layers of circuit layers. Preferably but not exclusively, the second plane 112 is on the top layer, and the first plane 111 is disposed on the any layer between the second layer and the N−1 layer of circuit layers. The first plane 111 is adjustable and disposed on any one of the plurality of intermediate layers, so that the first height difference H1 is formed between the first plane 111 and the second plane 112. Thus, the first component 20 having a thicker thickness is disposed on the first plane 111. In the embodiment, the area of the first plane 111 is at least larger than or equal to the outer profile of the first component 20. Certainly, the area, the shape and the size of the first plane 111 are adjustable according to the outer profile, the shape and the size of the first component 20. The present disclosure is not limited thereto and not redundantly described herein.

Figure 6:
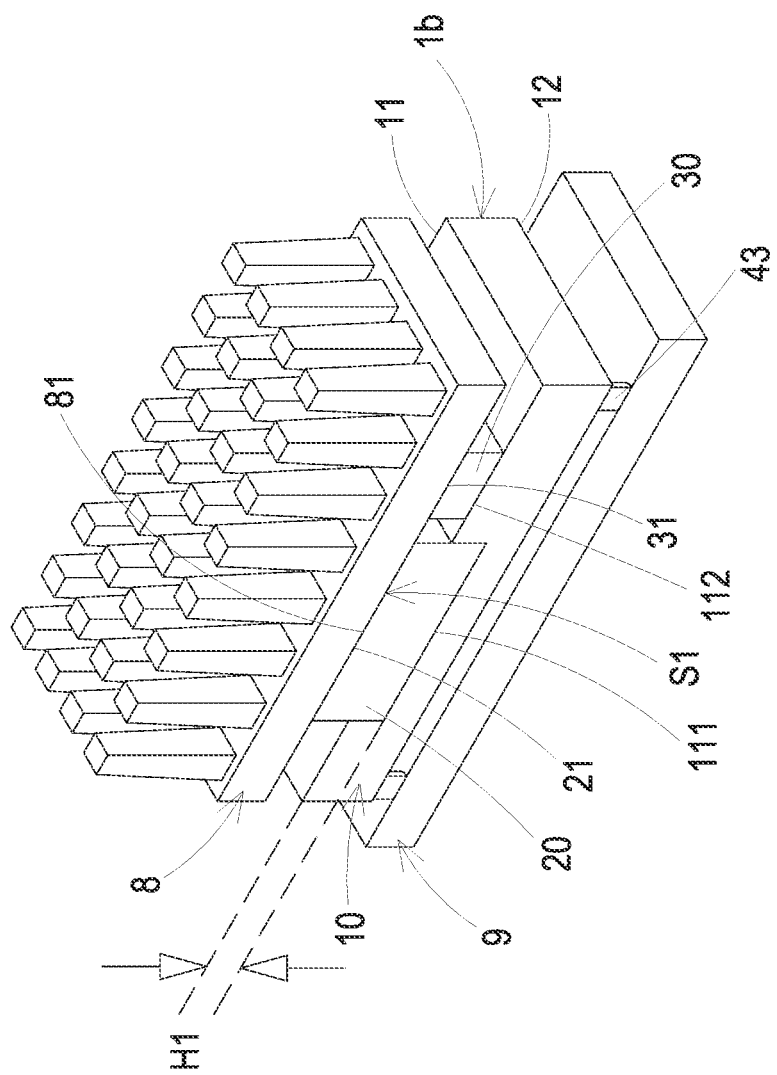
FIG. 6 is a cross-sectional structure illustrating a power module with a heat sink and a system board thereof according to a third embodiment of the present disclosure.

On the other hand, in the embodiment, the power module 1a is further connected to the system board 9 through the conductive components 42, which can be for example a set of at least two copper blocks surface-soldered to the system board 9. Preferably but not exclusively, the conductive component 42 is elongated at one end and can be soldered and fixed to the blind hole 14 of the second side 12 of the circuit board 10. The other end of the conductive component 42 is surface-soldered to the system board 9. FIG. 6 is a cross-sectional structure illustrating a power module with a heat sink and a system board thereof according to a third embodiment of the present disclosure. Similarly, in the embodiment, the power module 1a is connected to the system board 9 through the conductive components 43, which can be for example a set of at least two copper blocks surface-soldered to the system board 9. Preferably but not exclusively, the conductive component 43 is a copper block having two ends which are surface-soldered to the surface of the second side 12 of the circuit board 10 and the surface of the system board 9, respectively. It should be emphasized that the manner of mounting the power modules 1 and 1a on the system board 9 is adjustable according to the practical requirements. The present disclosure is not limited thereto, and not be redundantly described herein.

Figure 7A:
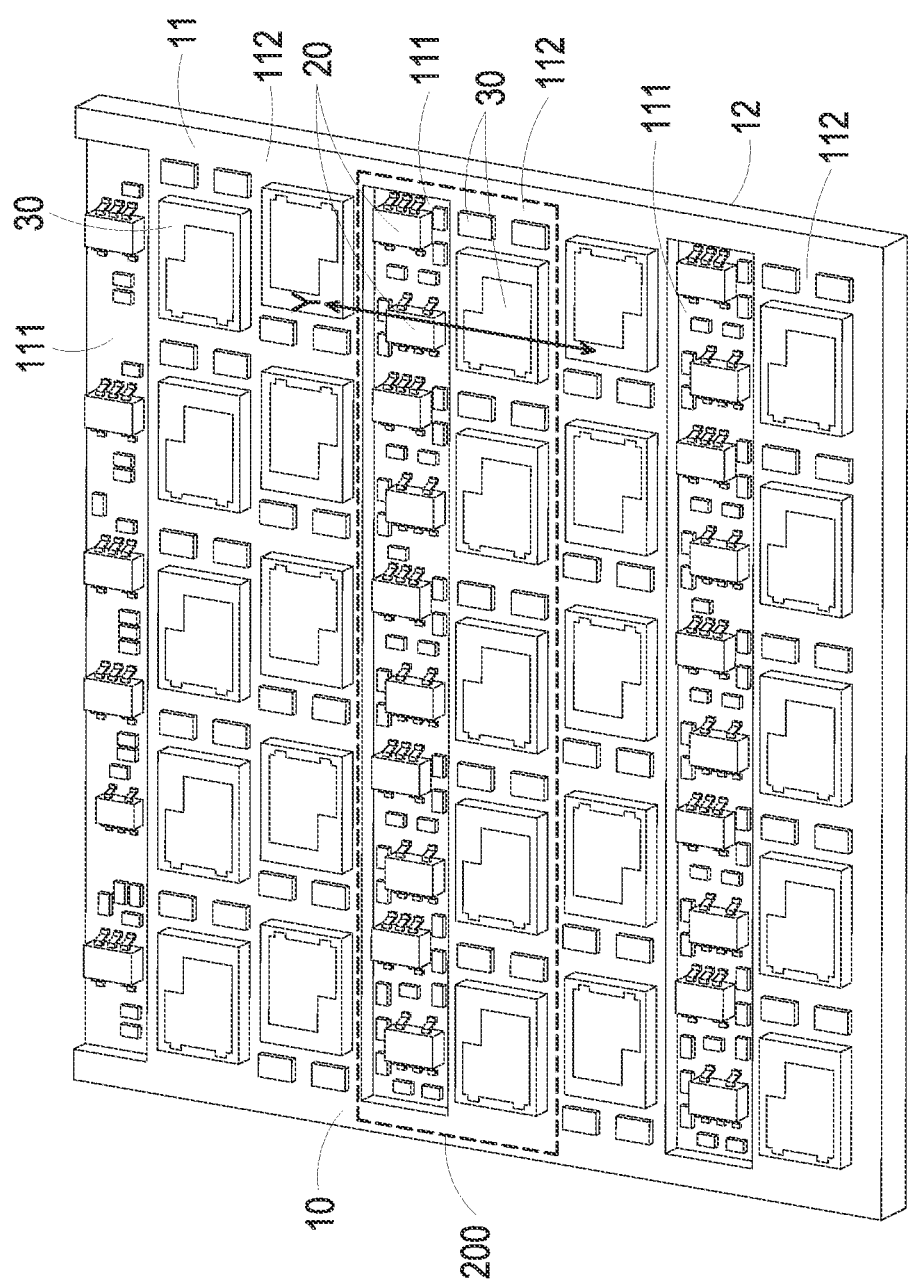
FIG. 7A is a perspective structural view illustrating a module according to a fourth embodiment of the present disclosure.
Figure 7B:
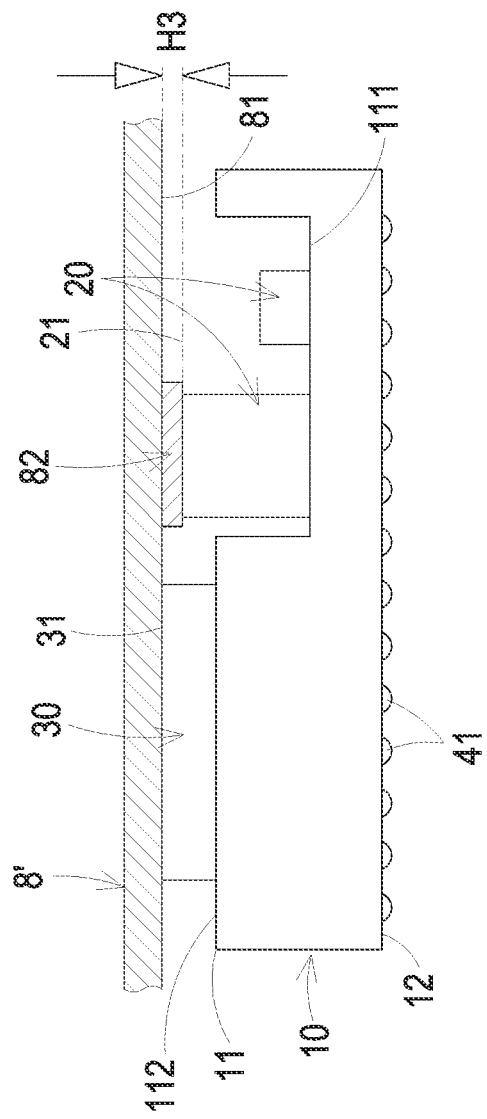
FIG. 7B is a vertical-sectional view illustrating an exemplary structure of FIG. 7A.

FIG. 7A is a perspective structural view illustrating a module according to a fourth embodiment of the present disclosure. FIG. 7B is a vertical-sectional view illustrating the module according to the fourth embodiment. In the embodiment, the structures, elements and functions of the module 1b' are similar to those of the power module 1b in FIG. 6, and are not redundantly described herein. In the embodiment, the module 1b' includes first planes 111 and second planes 112, some components disposed on the first planes 111 and the second planes 112.

FIG. 7B is a vertical-sectional view illustrating an exemplary structure of FIG. 7A, which is taken along a Y direction in the dashed-line frame 200 of FIG. 7A. In the embodiment, the module 1b' includes a circuit board 10, at least one first component 20 and at least one second component 30. The circuit board 10 includes a first side 11 and a second side 12. The first side 11 and the second side 12 are opposite to each other. In the embodiment, the circuit board 10 further includes at least one first plane 111 and at least one second plane 112 disposed on the surface of the first side 11. Preferably but not exclusively, the at least one first component 20 and the at least one second component 30 can be a magnetic component, a switch component or a passive component, respectively. Certainly, the present disclosure is not limited thereto. In the embodiment, the at least one first component 20 includes a first contact surface 21. The at least one second component 30 includes a second contact surface 31.

While the first component 20 is attached to the first plane 111 and the second component 30 is attached to the second plane 112, a third height difference H3 is formed between the first contact surface 21 and the second contact surface 31. The second contact surface 31 is a part of a first surface S1 of the module 1b'. The heat dissipation device 8' (for example, a baseplate) is attached to the second contact surface 31. Here, the at least one second component 30 is a heat-generating component. The heat dissipation device 8' such as the baseplate is attached to the first contact surface 21 through the thermal interface materials 82, such as a thermal conductive sheet, a thermal conductive adhesive or a thermal conductive paste. The present disclosure is not limited thereto, and not redundantly described herein.

Figure 7C:
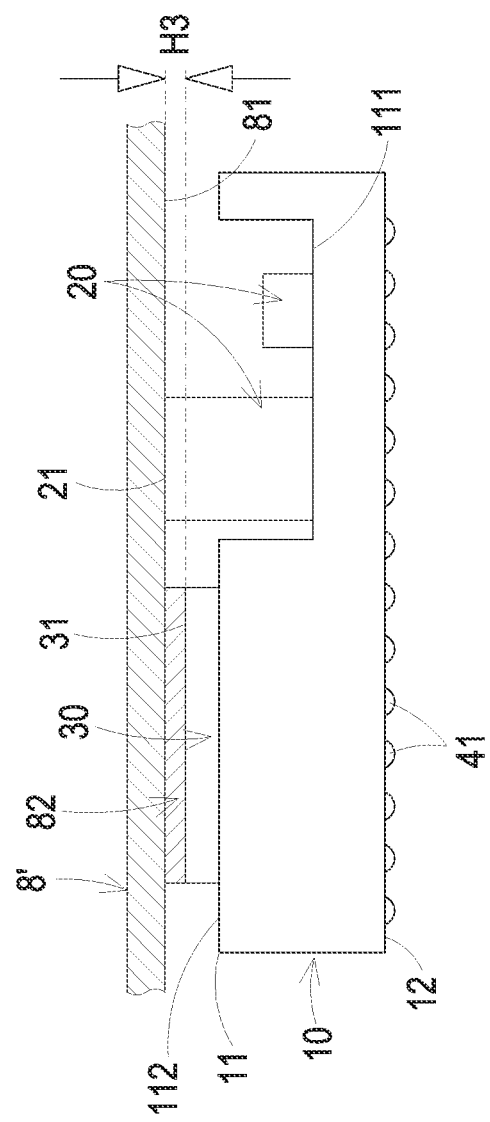
FIG. 7C is a vertical-sectional view illustrating another exemplary structure of FIG. 7A.

FIG. 7C is a vertical-sectional view illustrating another exemplary structure of FIG. 7A, which is taken along a Y direction in the dashed-line frame 200 of FIG. 7A. While the first component 20 is attached to the first plane 111 and the second component 30 is attached to the second plane 112, a third height difference H3 is formed between the first contact surface 21 and the second contact surface 31. The first contact surface 21 is a part of a first surface S1 of the module 1b. The heat dissipation device 8' (for example, a baseplate) is attached to the first contact surface 21. The heat dissipation device 8' such as the baseplate is attached to the second contact surface 31 through the thermal interface materials 82, such as a thermal conductive sheet, a thermal conductive adhesive or a thermal conductive paste. The present disclosure is not limited thereto, and not redundantly described herein.

Thus, the first surface S1 of the module 1b' is advantageously assembled and fixed to the heat dissipation device 8' such as the baseplate, so that the first contact surface 21 of the first component 20 or the second contact surface 31 of the second component 30 are sufficiently adhered to the heat dissipation surface 81 of the heat dissipation device 8' such as the baseplate and an optimal heat dissipation effect is achieved.

In the embodiments, the module 1b' further includes at least one conductive component 41. Preferably but not exclusively, the at least one conductive component 41 includes a plurality of BGA (Ball Grid Array Package) disposed on the second side 12 of the power module 1. In the embodiment, the module 1b' is connected to a system board 9 through the conductive component 41.

Figure 8:
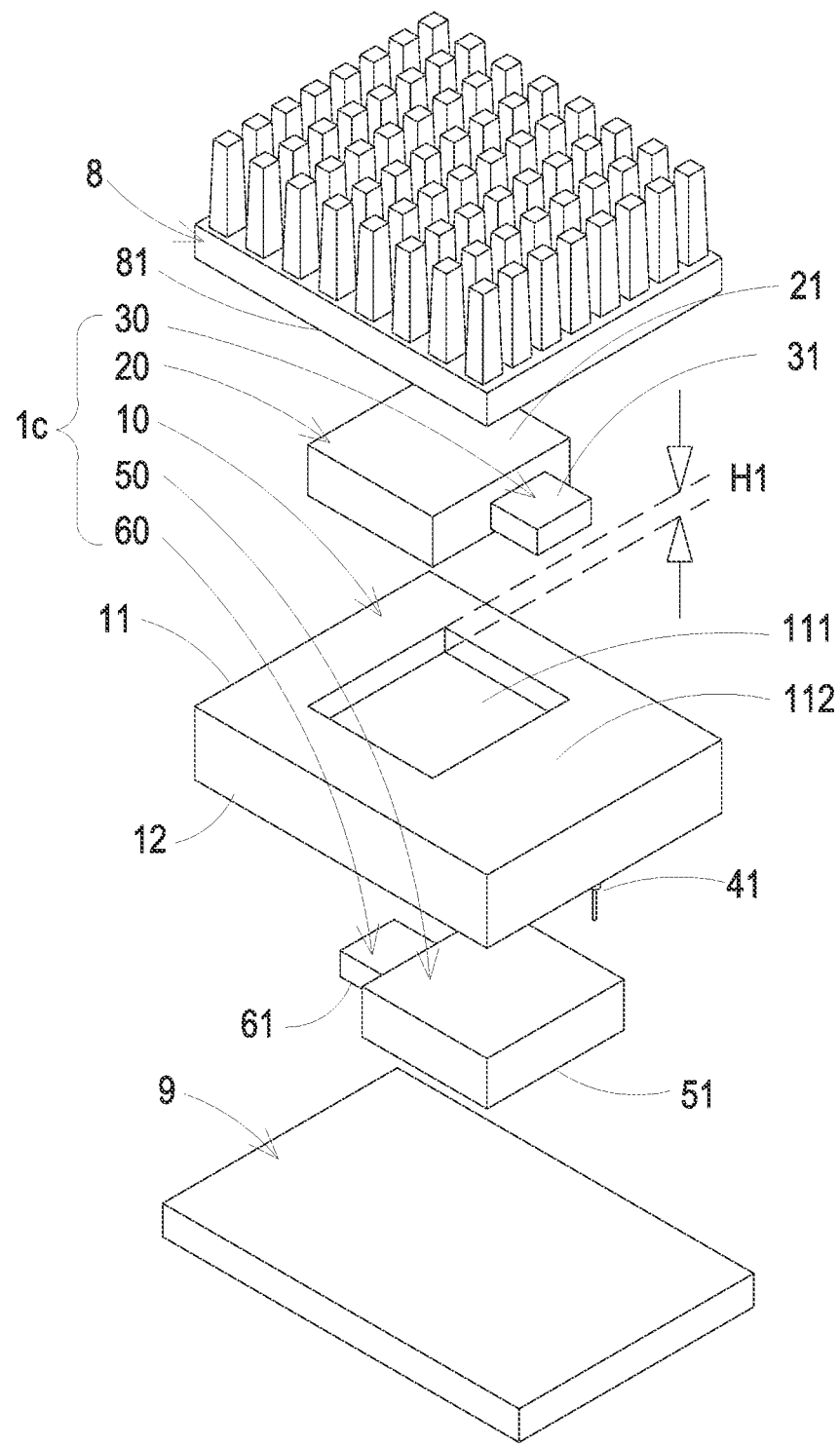
FIG. 8 is an exploded view illustrating a power module with a heat sink and a system board thereof according to a fifth embodiment of the present disclosure.
Figure 9:
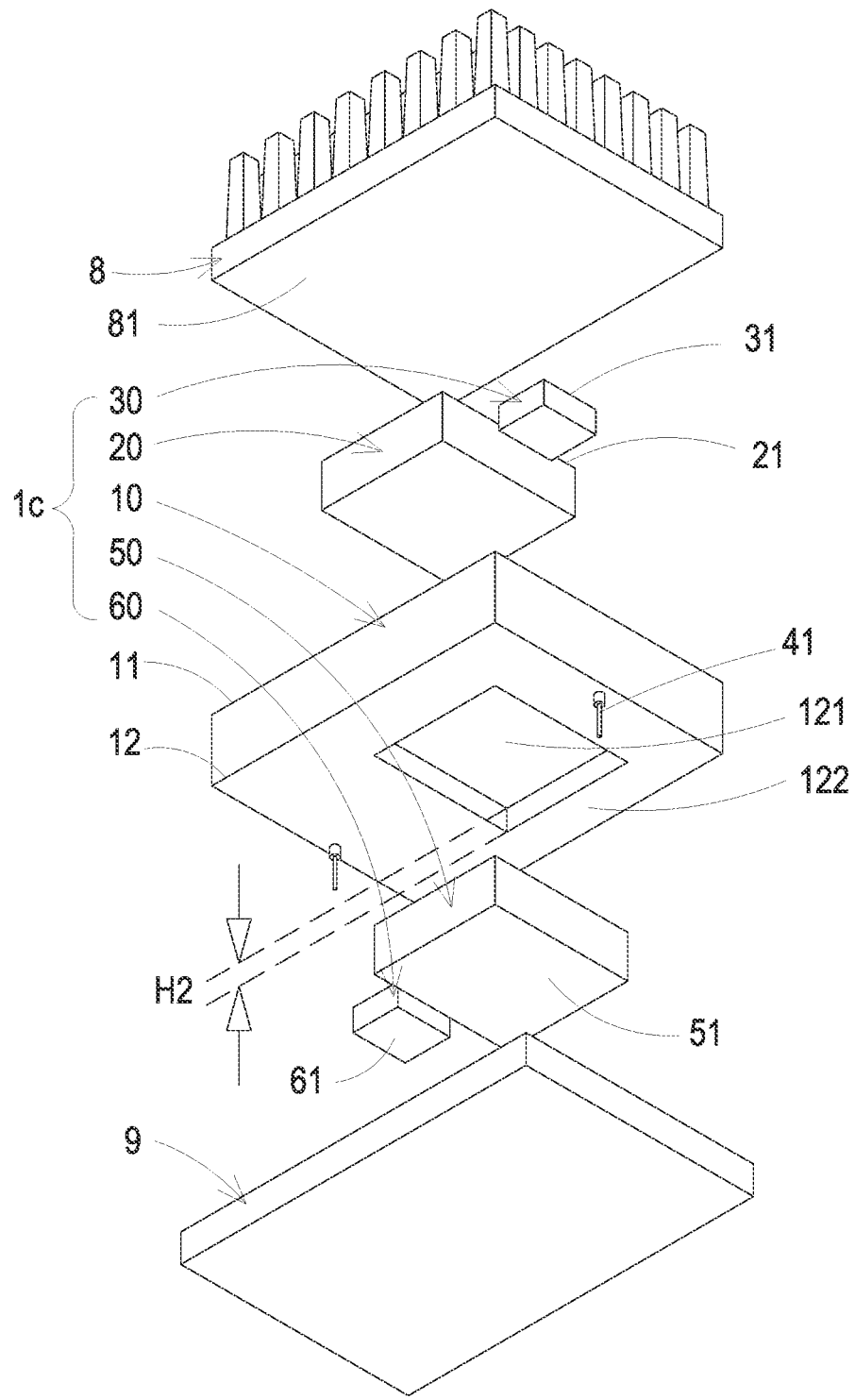
FIG. 9 is an exploded view illustrating the power module with the heat sink and the system board thereof according to the fifth embodiment of the present disclosure and taken from another viewing angle.
Figure 10:
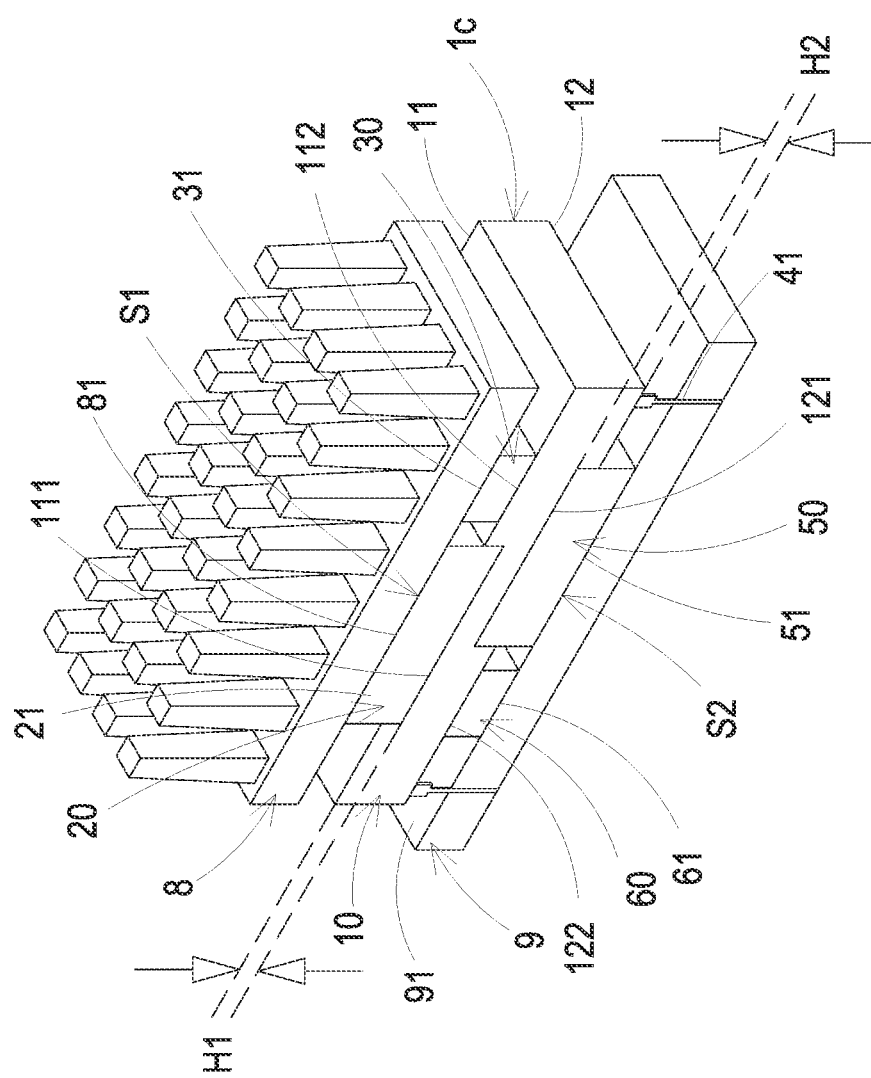
FIG. 10 is a cross-sectional structure illustrating the power module with the heat sink and the system board thereof according to the fifth embodiment of the present disclosure.
Figure 11:
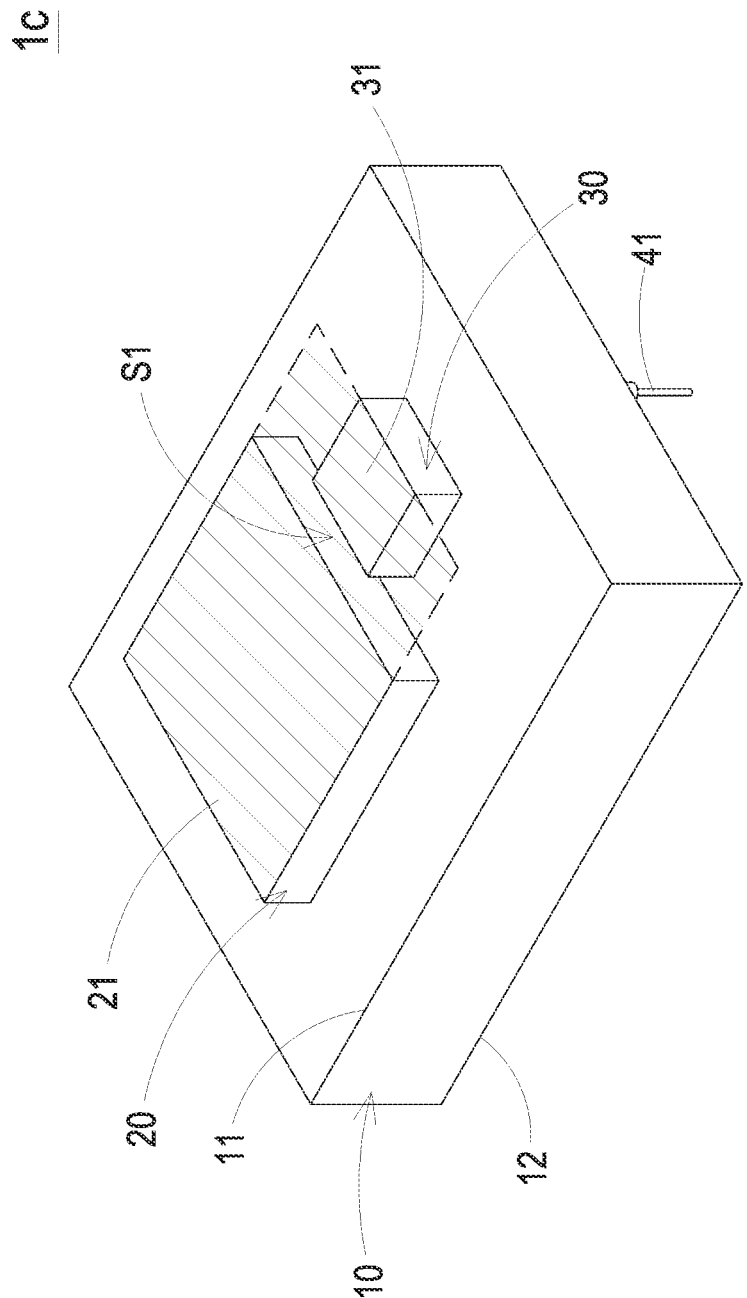
FIG. 11 is a perspective structural view illustrating the power module according to the fifth embodiment of the present disclosure.
Figure 12:
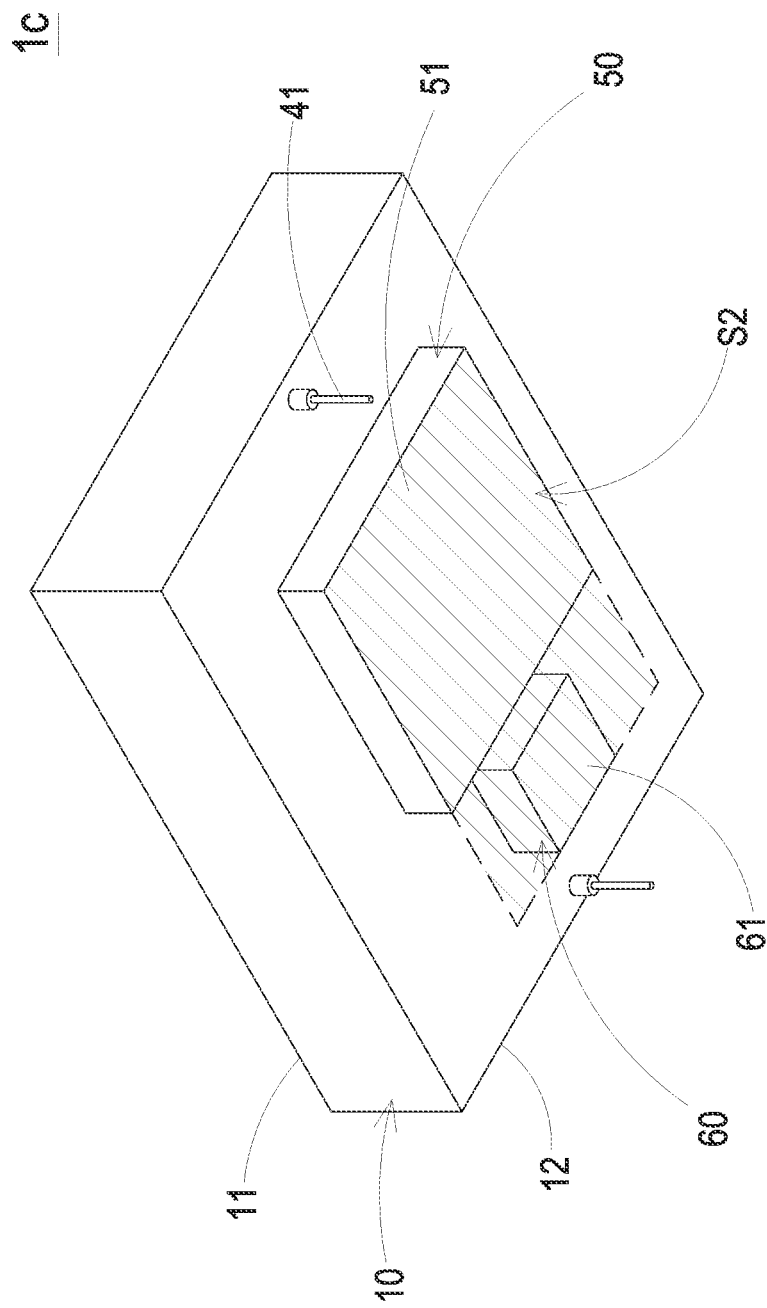
FIG. 12 is a perspective structural view illustrating the power module according to the fifth embodiment of the present disclosure and taken from another viewing angle.

FIG. 8 is an exploded view illustrating a power module with a heat sink and a system board thereof according to a fifth embodiment of the present disclosure. FIG. 9 is an exploded view illustrating the power module with the heat sink and the system board thereof according to the fifth embodiment of the present disclosure and taken from another viewing angle. FIG. 10 is a cross-sectional structure illustrating the power module with the heat sink and the system board thereof according to the fifth embodiment of the present disclosure. FIG. 11 is a perspective structural view illustrating the power module according to the fifth embodiment of the present disclosure. FIG. 12 is a perspective structural view illustrating the power module according to the fifth embodiment of the present disclosure and taken from another viewing angle. In the embodiment, the structures, elements and functions of the power module 1c are similar to those of the power module 1 in FIGS. 1 to 3, and are not redundantly described herein. Different from the power module 1 of FIGS. 1 to 3, in the embodiment, the power module 1c includes a circuit board 10, at least one first component 20, at least one second component 30, at least one third component 50 and at least one fourth component 60. The circuit board 10 includes a first side 11 and a second side 12. The first side 11 and the second side 12 are opposite to each other. In the embodiment, the circuit board 10 includes at least one first plane 111, at least one second plane 112, at least one third plane 121 and at least one fourth plane 122. The at least one first plane 111 and the at least one second plane 112 are disposed on the surface of the first side 11 and at least one first height difference H1 is formed between the at least one first plane 111 and the at least one second plane 112. The at least one third plane 121 and the at least one fourth plane 122 are disposed on the surface of the second side 12 and at least one second height difference H2 is formed between the at least one third plane 121 and the at least one fourth plane 122. The first height difference H1 and the second height difference H2 are not limited to being the same height difference. In an embodiment, the first plane 111 and the third plane 121 are vertically aligned and overlapped with each other. In another embodiment, the first plane 111 and the third plane 121 are staggered with each other but not overlapped. In other embodiment, the first plane 111 and the third plane 121 are arranged arbitrarily. The present disclosure is not limited thereto. In the embodiment, the at least one first component 20 and the at least one second component 30 are disposed on the at least one first plane 111 and the at least one second plane 112, respectively. The at least one first component 20 includes at least one first contact surface 21, the at least one second component 30 includes at least one second contact surface 31, and the at least one first contact surface 21 and the at least one second contact surface 31 are parts of a first surface S1 of the power module 1c. In the embodiment, the first surface S1 is the slash area shown in FIG. 11. On the other hand, the at least one third component 50 includes at least one third contact surface 51, the at least one fourth component 60 includes at least one fourth contact surface 61, and the at least one third contact surface 51 and the at least one fourth contact surface 61 are parts of a second surface S2 of the power module 1c. In the embodiment, the second surface S2 is the slash area shown in FIG. 12. Consequently, the first surface S1 and the second surface S2 are formed on the first side 11 and the second side 12 of the circuit board 10, respectively. Thus, the first surface S1 of the power module 1c is advantageously assembled and fixed to a heat sink 8, so that the first contact surface 21 of the first component 20 and the second contact surface 31 of the second component 30 are sufficiently adhered to the heat dissipation surface 81 of the heat sink 8 and an optimal heat dissipation effect is achieved. Moreover, the second surface S2 of the power module 1c is advantageously assembled and fixed to a system board 9, so that the third contact surface 51 of the third component 50 and the fourth contact surface 61 of the fourth component 60 are sufficiently adhered to the surface 91 of the system board 9 and it benefits to simplify the overall system design. In other words, while the power module 1c of the present disclosure is applied to, for example, a DC/DC power module, the power module 1c is disposed between the heat sink 8 and the system board 9. Consequently, the optimal heat dissipation effect is achieved and the overall power density is enhanced simultaneously. In other embodiments, the first surface S1 and the second surface S2 are attached to two heat sinks 8 or two system boards 9. Notably, the number and the type of the first surface S1 and the second surface S2 attached to the heat sinks 8 or the system boards 9 are adjustable according to the practical requirement. The present disclosure is not limited thereto, and not redundantly described herein.

Figure 13:
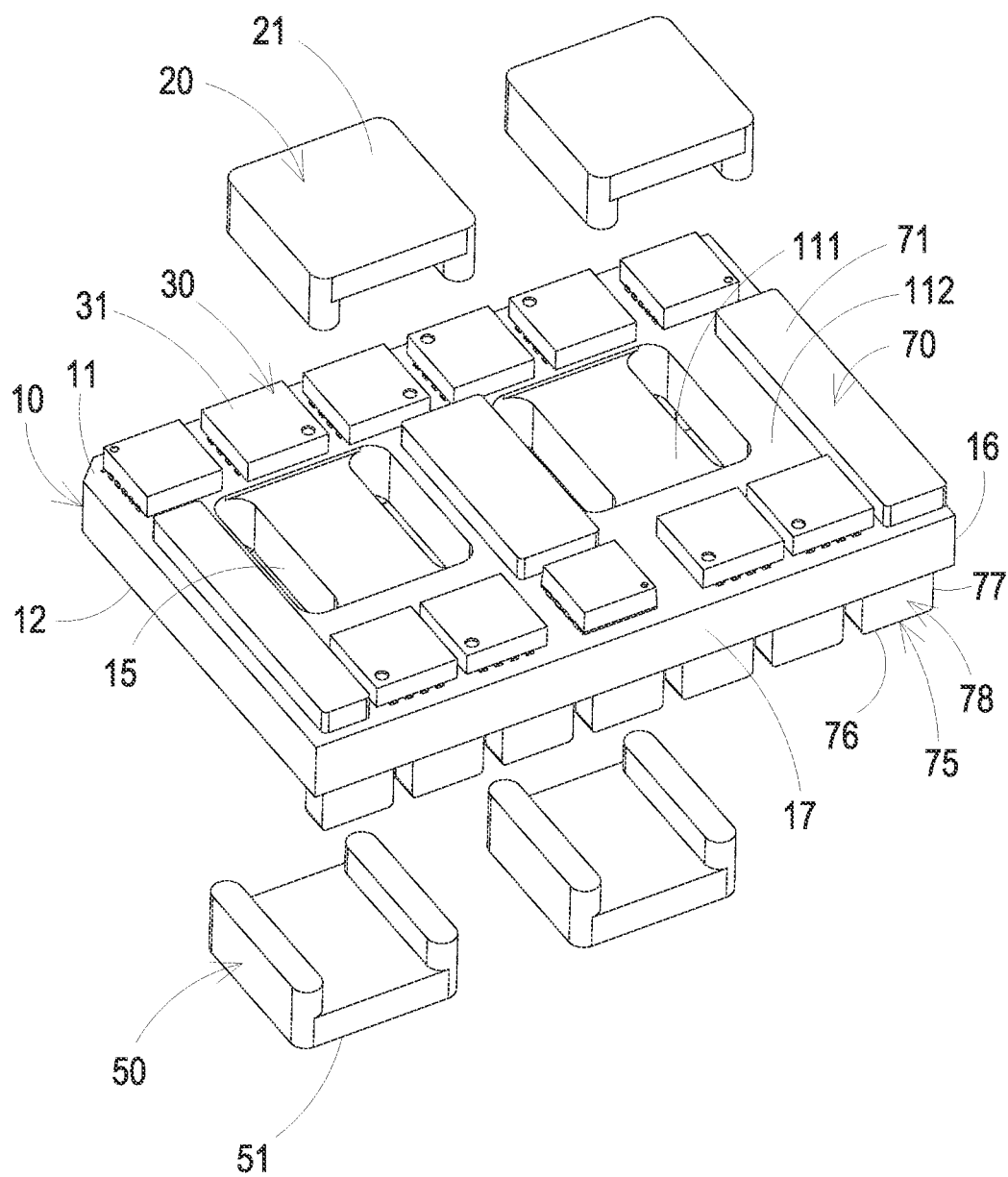
FIG. 13 is an exploded view illustrating a power module according to a sixth embodiment of the present disclosure.
Figure 14:
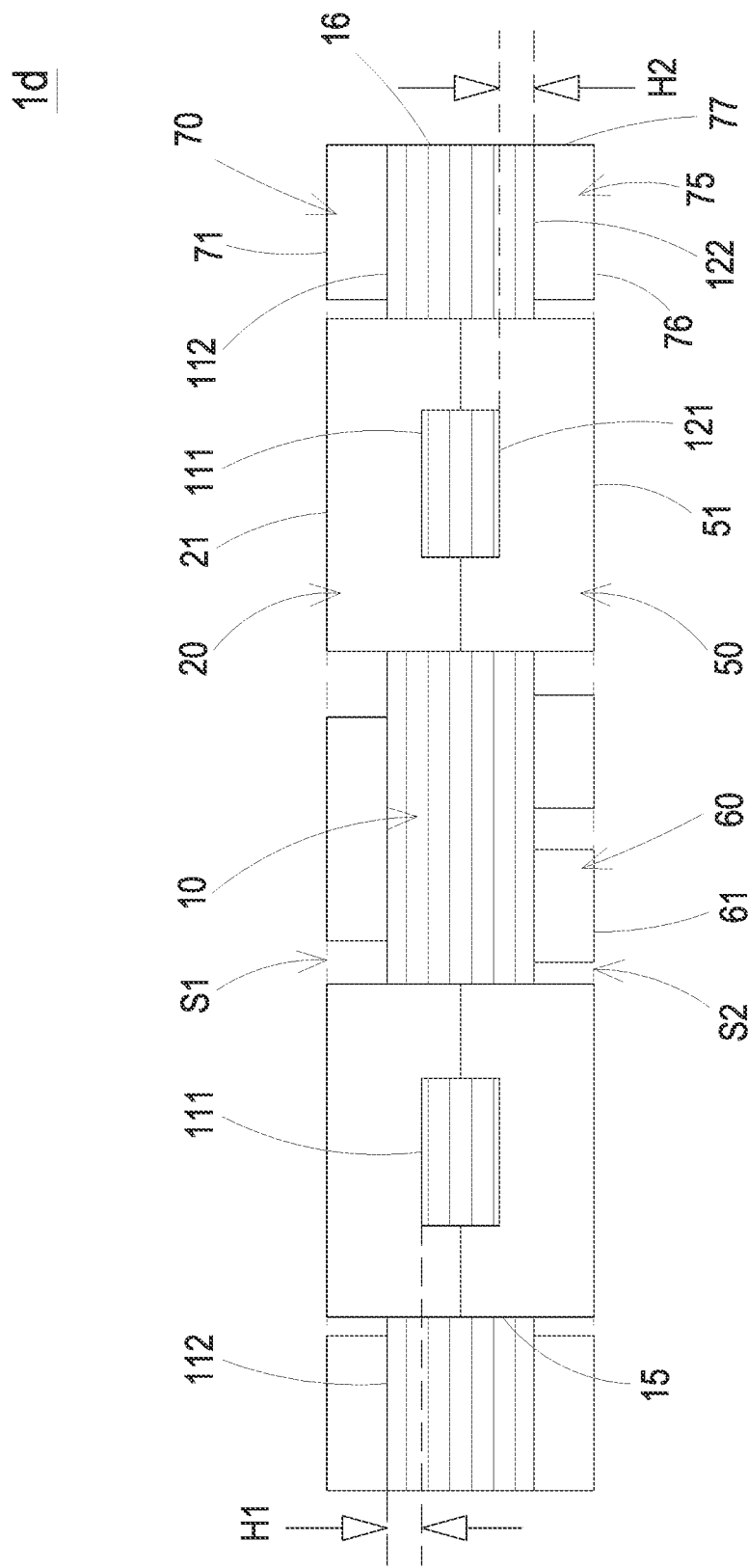
FIG. 14 is a cross-sectional view illustrating the power module according to the sixth embodiment of the present disclosure.

FIG. 13 is an exploded view illustrating a power module according to a sixth embodiment of the present disclosure. FIG. 14 is a cross-sectional view illustrating the power module according to the sixth embodiment of the present disclosure. In the embodiment, the structures, elements and functions of the power module 1d are similar to those of the power module 1c in FIGS. 7 to 11, and are not redundantly described herein. In the embodiment, the at least one first plane 111 and the at least one second plane 112 are parts of the first side 11, and the at least one first height difference H1 is formed between the at least one first plane 111 and the at least one second plane 112. Moreover, the at least one third plane 121 and the at least one fourth plane 122 are parts of the second side 12, and the at least one second height difference H2 is formed between the at least one third plane 121 and the at least one fourth plane 122. Different from the power module 1c of FIGS. 7 to 11, in the embodiment, the circuit board 10 of the power module 1d further includes two openings 15 running through the first plane 111 and the third plane 121. The first component 20 and the third component 50 includes a first magnetic core and a second magnetic core, respectively. The first magnetic core and the second magnetic core are connected with each other through the two openings 15, and a transformer is formed according to the two magnetic cores and a planar winding (not shown) on the circuit board 10. Preferably but not exclusively, the second component 30 disposed on the first side 11 of the circuit board 10 can be a single-sided heat-dissipating MOSFET or a double-sided heat-dissipating MOSFET, and is disposed on the second plane 112 of the circuit board 10. The first magnetic core of the first component 20 and the MOSFET of the second component 30 have different thicknesses, but the first height difference H1 is adjustable to make the first contact surface 21 of the first component 20 and the second contact surface 31 of the second component 30 be configured as the first surface S1. In that, the heat generated by the second component 30 such as the MOSFET can be rapidly dissipated away through the circuit board 10 and dissipated away through the heat dissipation surface 81 of the heat sink 8.

In the embodiment, the power module 1d further includes a first metal device 70, for example a metal copper bar, disposed on the second plane 112 and located on the first side 11. Preferably but not exclusively, the first metal device 70 has the thickness similar to that of the second component 30. In the embodiment, the first metal device 70 includes a first metal contact surface 71, coplanar with the first surface S1 of the first side 11. The first metal device 70 can be fixed to the second plane 112 of the circuit board 10 by surface-soldering or an adhesive. In the embodiment, the first metal contact surface 71, the first contact surface 21 and the second contact surface 31 are coplanar with the first surface S1. In the embodiment, when the heat sink 8 is attached to the first surface S1, since the first metal device 70 have good thermal conducting characteristics and it benefits to enhance the heat dissipation capability of the power module 1d. Moreover, the first metal device 70 such as a metal copper bar can be added to increase the pressure resistance and the supporting ability of the power module 1d.

Moreover, in the embodiment, a second metal device 75, for example a leading frame, is disposed on the second side 12 of the circuit board 10. The second metal device 75 includes a first metal contact surface 76. Preferably but not exclusively, the third component 50 is the second magnetic core and the fourth component 60 is the other switch component. The first metal contact surface 76, the third contact surface 51 of the third component 50 and the fourth contact surface 61 of the fourth component 60 are coplanar with the second surface S2. Moreover, the second metal device 75 includes a second metal contact surface 77 and a third metal contact surface 78, which are formed on a first lateral wall 16 and a second lateral wall 17 of the power module 1d. The tin can be further electroplated thereon for electrical connection. Since the second metal device 75 has good structural characteristics and disposed on the second surface S2 evenly, it is advantage to improve the integrated assembly of the power module 1d and the system board 9, and simplify the process of electric connection. In addition, the second metal device 75 such as the lead frame is added to increase the pressure resistance and support capability of the power module 1d.

Figure 15:
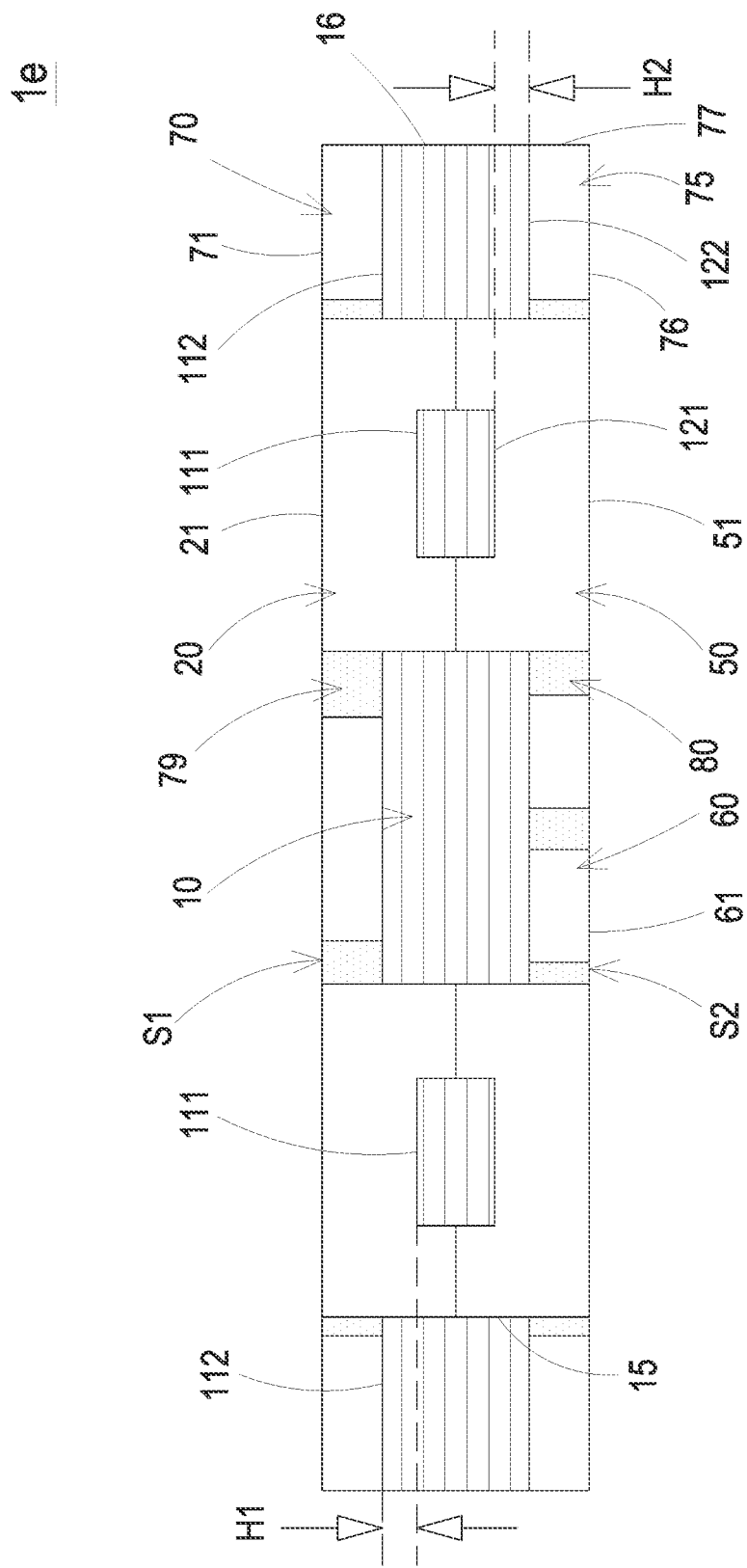
FIG. 15 is a cross-sectional view illustrating a power module according to a seventh embodiment of the present disclosure.

FIG. 15 is a cross-sectional view illustrating a power module according to a seventh embodiment of the present disclosure. In the embodiment, the structures, elements and functions of the power module 1e are similar to those of the power module 1d in FIGS. 12 to 13, and are not redundantly described herein. In an embodiment, the power module 1e includes at least one molding layer 79 disposed on the first side 11 of the circuit board 10. The at least one molding layer 79 covers the at least one first component 20, the at least one second component 30 (referring to FIG. 13) and the at least one first metal device 70 and exposes at least one of the at least one first contact surface 21, the at least one second contact surface 31 (referring to FIG. 13) or the first metal contact surface 71. In another embodiment, the power module 1e further includes another molding layer 80 disposed on the second side 12 of the circuit board 10. The molding layer 80 covers the at least one third component 50, the at least one fourth component 60 or at least one second metal device 75 and exposes the at least one fourth contact surface 61, the first metal contact surface 76, the second metal contact surface 77 and the third metal contact surface 78 (referring to FIG. 13). Alternatively, the molding layer 80 exposes the at least one third contact surface 51, the at least one fourth contact surface 61, the first metal contact surface 76, the second metal contact surface 77 and the third metal contact surface 78. Notably, the molding layers 79 and 80 can package the power module 1e into one piece by using an epoxy molding compound (EMC). The at least one first contact surface 21, the at least one second contact surface 31 and the first metal contact surface 71 are configured to form the first surface S1 which is flat. The at least one third contact surface 51, the at least one fourth contact surface 61 and the first metal contact surface 76 are configured to form the second surface S2 which is flat. Consequently, the flat structure of the power module 1e is achieved. It benefits to reduce the design complexity of the heat sink 8 and the system board 9 and improve the power density. In an embodiment, after packaging by the epoxy molding compound (EMC), the first surface S1 is formed by polishing the molding layer 79 to expose at least one of the at least one first contact surface 21 and the first metal contact surface 71. The second surface S2 is formed by polishing the molding layer 80 to expose the at least one fourth contact surface 61, the first metal contact surface 76 and the second metal contact surface 77. Alternatively, the at least one third contact surface 51, the at least one fourth contact surface 61, the first metal contact surface 76, the second metal contact surface 77 and the third metal contact surface 78 are exposed. In an embodiment, the molding layer 79 can be polished selectively in the above polishing process, to form the first surface S1 merely. In another embodiment, the molding layer 80 can be polished selectively in the above polishing process, to form the second surface S2 merely. In other embodiments, the molding layer 79 and the molding layer 80 are polished to form the first surface S1 and the second surface S2 and the contact surfaces described above are exposed. Alternatively, the molding layer 79 is disposed on the first side 11 or the second side 12 merely. For example, the molding layer 79 is formed on the second side 12 of the circuit board 10 of the power module 1a of FIG. 5, and the conductive component 42 is exposed selectively. The present disclosure is not limited thereto. It should be emphasized that by forming the molding layer 79 and the molding layer 80 and polishing to expose the contact faces of some components, the tolerance of the total height of the power module in mass production can be further effectively eliminated, and the assembling convenience of the heat sink 8 or the system board 9 can be enhanced.

Taking the power module 1e as an example, in the mass production, when a plurality of power modules 1e have to be packaged simultaneously, the plurality of power modules 1e can be placed in a molding chamber, respectively, and packaged into the plurality of power modules 1e separately. Alternatively, in another embodiment, the corresponding components can be assembled by using a connection panel of the printed circuit boards to form a plurality of power modules 1e connected on the connection panel. The entire structure of the power modules 1e connected on the connection panel is placed in a molding chamber for packaging. After packaging, the plurality of power modules 1e are separated by using a cutting method. While being cut, the second metal contact surface 77 or the third metal contact surface 78 of the second metal device 75 can be exposed. Alternatively, the second metal contact surface 77 or the third metal contact surface 78 of the second metal device 75 is exposed by polishing. In an embodiment, the tin can be further electroplated on the second metal contact surface 77 and the third metal contact surface 78 for electrical connection. The present disclosure is not limited thereto.

In addition, when the power module 1e is packaged in the molding layer 79, in order to avoid the phenomenon that the soldered joints on the circuit board 10 may be re-melted during the packaging process, the conductive adhesive may be used instead of the solder to adhere the components to the circuit board 10. The conductive adhesive is cured after being heated at a specific temperature. In that, when the power module 1e is molded, the phenomenon of secondary re-melting does not occur. In other embodiments, each component independently disposed on the circuit board 10 includes a pin coated with a material of AgPdCu to effectively prevent the problem that the pins are easily oxidized after the conductive adhesive is applied. However, it is not essential feature to limit the present disclosure and not redundantly described herein.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A module comprising:
   a circuit board comprising a first side and a second side opposite to each other, wherein the circuit board comprises at least one first plane and at least one second plane, which are disposed on a surface of the first side, and a first height difference is formed between the at least one first plane and the at least one second plane;
   at least one first component and at least one second component disposed on the at least one first plane and the at least one second plane, respectively, wherein the at least one first component comprises at least one first contact surface, the at least one second component comprises at least one second contact surface, and the at least one first contact surface and the at least one second contact surface are parts of a first surface of the module; and
   a heat dissipation device having a heat-dissipation surface matched with the first surface, wherein the heat-dissipation surface is attached to the at least one first contact surface and the at least one second contact surface.

2. The module according to claim 1, further comprising a thermal interface material, wherein the heat-dissipation surface is attached to the at least one first contact surface or the at least one second contact surface through the thermal interface materials, wherein the thermal interface materials is a thermal conductive sheet, a thermal conductive or a thermal conductive paste.

3. The module according to claim 1, wherein the at least one first component and the at least one second component are one selected from the group consisting of a magnetic component, a switch component, a passive component and combinations thereof.

4. The module according to claim 1, wherein the circuit board comprises at least one conductive portion disposed between the at least one first plane and the first component, wherein the at least one first plane and the first surface have a distance greater than that of the at least one second plane and the first surface, and wherein the at least one conductive portion comprises a conductive adhesive or a solder.

5. The module according to claim 1, further comprising a metal device disposed on the first side and electrically connected to the circuit board, wherein the metal device comprises a first metal contact surface coplanar with the first surface of the module, and wherein the metal device further comprises a second metal contact surface coplanar with a lateral wall of the module.

6. The module according to claim 1, further comprising a molding layer disposed on the first side of the circuit board, wherein the molding layer covers the at least one first component and the at least one second component, exposes at least one of the at least one first contact surface and the at least one second contact surface.

7. The module according to claim 6, wherein the first surface is formed by polishing the molding layer, to expose at least one of the at least one first contact surface and the at least one second contact surface.

8. The module according to claim 1, further comprising a conductive component disposed on the second side of the circuit board, wherein the conductive component is one selected from the group consisting of a pin, a copper block pin and a copper block.

9. The module according to claim 1, wherein the circuit board is a multilayer circuit board comprising a plurality of intermediate layers, and the at least one first plane is disposed on at least one of the plurality of intermediate layers.

10. The module according to claim 1, wherein the circuit board further comprises at least one third plane and at least one fourth plane, wherein the at least one third plane and the at least one fourth plane are disposed on the surface of the second side of the circuit board, and a second height difference is formed between the at least one third plane and the at least one fourth plane;
    wherein the power module further comprises at least one third component and at least one fourth component disposed on the at least one third plane and the at least one fourth plane, respectively, wherein the at least one third component comprises at least one third contact surface, the at least one fourth component comprises at least one fourth contact surface, and the at least one third contact surface and the at least one fourth contact surface are parts of a second surface of the module.

11. The module according to claim 10, further comprising at least one heat dissipation device having a heat-dissipation surface matched with the second surface, wherein the heat-dissipation surface is attached to the at least one third contact surface or the at least one fourth contact surface.

12. The module according to claim 10, wherein the second surface is attached to a system board.

13. The module according to claim 10, wherein the at least one first plane and the first surface have a distance greater than that of the at least one second plane and the first surface, and the at least one third plane and the second surface have a distance greater than that of the at least one fourth plane and the second surface, wherein the circuit board comprises at least two openings running through the first plane and the third plane, and the first component and the third component comprise a first magnetic core and a second magnetic core, respectively, wherein the first magnetic core and the second magnetic core are connected with each other through the two openings.

14. The module according to claim 10, wherein the at least one third component and the at least one fourth component are one selected from the group consisting of a magnetic component, a switch component, a passive component and a combination thereof.

15. The module according to claim 10, further comprising at least one metal device disposed on the second side and electrically connected to the circuit board, wherein the at least one metal device comprises a first metal contact surface coplanar with the second surface of the module, and wherein the at least one metal device further comprises a second metal contact surface and a third metal contact surface which are coplanar with a first lateral wall of the module and a second lateral wall of the module respectively.

16. The module according to claim 10, further comprising a molding layer disposed on the second side of the circuit board, wherein the molding layer covers the at least one third component and the at least one fourth component, and exposes at least one of the at least one third contact surface and the at least one fourth contact surface.

17. The module according to claim 16, wherein the second surface is formed by polishing the molding layer, to expose at least one of the at least one third contact surface and the at least one fourth contact surface.

18. The module according to claim 10, further comprising a molding layer disposed on the first side or/and the second side of the circuit board, wherein the molding layer covers the at least one first component and the at least one second component or/and the at least one third component and the at least one fourth component, and exposes at least one of the at least one first contact surface, the at least one second contact surface, the at least one third contact surface and the at least one fourth contact surface.

19. The module according to claim 18, wherein the first surface or/and the second surface are formed by polishing the molding layer, to expose at least one of the at least one first contact surface, the at least one second contact surface, the at least one third contact surface and the at least one fourth contact surface.

20. The module according to claim 10, wherein the circuit board is a multilayer circuit board comprising a plurality of intermediate layers, and the at least one first plane and the at least one third plane are disposed on at least one of the plurality of intermediate layers.

21. The module according to claim 10, further comprising a conductive component disposed on the second side of the circuit board, wherein the conductive component is one selected from the group consisting of a pin, a copper block pin and a copper block.

* * * * *